United States Patent [19]

Hawley et al.

[11] Patent Number: 5,055,712

[45] Date of Patent: Oct. 8, 1991

[54] REGISTER FILE WITH PROGRAMMABLE CONTROL, DECODE AND/OR DATA MANIPULATION

[75] Inventors: David W. Hawley, Belmont; Scott K. Pickett, San Jose; Frederick K. Y. Leung, Cupertino, all of Calif.

[73] Assignee: National Semiconductor Corp., Santa Clara, Calif.

[21] Appl. No.: 504,967

[22] Filed: Apr. 5, 1990

[51] Int. Cl.[5] .............................................. G06F 9/00
[52] U.S. Cl. ..................................... 307/465; 307/468; 307/469; 364/716; 364/736
[58] Field of Search ....................... 307/465, 468, 469; 364/716, 736, 748, 749

[56] References Cited

U.S. PATENT DOCUMENTS

| | | | |
|---|---|---|---|
| 3,569,685 | 3/1971 | Chesley | 364/749 |
| 3,593,317 | 7/1971 | Fleisher | 340/166 |
| 3,849,638 | 11/1974 | Greer | 307/465 X |
| 3,949,370 | 4/1976 | Reyling, Jr. et al. | 364/200 |
| 4,034,356 | 7/1977 | Howley et al. | 307/465 X |
| 4,124,899 | 11/1978 | Birkner et al. | 364/716 |
| 4,215,417 | 6/1980 | Nishitani | 364/736 |
| 4,233,667 | 11/1980 | Devine et al. | 364/716 X |
| 4,293,783 | 10/1981 | Patil | 307/465 |
| 4,348,737 | 9/1982 | Cukier et al. | 307/465 X |
| 4,422,072 | 12/1983 | Cavlan | 307/465 X |
| 4,482,953 | 11/1984 | Burke | 364/200 |
| 4,495,590 | 1/1985 | Mitchell, Jr. | 364/716 |
| 4,506,173 | 3/1985 | Yum | 307/466 |
| 4,617,649 | 10/1986 | Kyomasu et al. | 365/189 |
| 4,641,278 | 2/1987 | Saito | 365/49 |
| 4,660,171 | 4/1987 | Moore et al. | 364/716 X |
| 4,675,556 | 6/1987 | Bazes | 307/465 |
| 4,703,206 | 10/1987 | Cavlan | 307/465 |
| 4,734,876 | 3/1988 | Williams | 364/748 |
| 4,742,252 | 5/1988 | Agrawal | 307/465 |
| 4,791,603 | 12/1988 | Henry | 307/465 X |
| 4,803,622 | 2/1989 | Bain, Jr. et al. | 364/200 |
| 4,807,183 | 2/1989 | Kung et al. | 364/900 MS |
| 4,811,296 | 3/1989 | Garde | 365/189 |
| 4,829,425 | 5/1989 | Bain, Jr. et al. | 364/200 |
| 4,853,886 | 8/1989 | Shigehara | 364/736 |
| 4,996,661 | 2/1991 | Cox et al. | 364/726 |

OTHER PUBLICATIONS

IBM Technical Disclosure Bulletin, vol. 24, No. 6, Nov. 1981, "PLA Having OR-Array Bit Partitioning", L. D. Whitely.

IBM Technical Disclosure Bulletin, vol. 19, No. 5, Oct. 1976. "Multiple Partitioned Programmable Logic Array", S. B. Greenspan.

"Programmable Logic Array Read/Write Controller", IBM Technical Disclosure Bulletin, vol. 22, No. 2, Jul. 1979.

"Multiport Register File Simplifies and Speeds Digital Signal Processing", *Electronic Design,* May 17, 1984, pp. 213–222.

"Multiport Register File Streamlines Signal Processing", *EDN,* Nov. 15, 1984, pp. 301–306.

"Latch Array Provides Bank of Control Words", *Design Ideas, EDN,* Sep. 4, 1986.

"PLD Controls a RAM-Based LIFO Memory", *Design Ideas, EDN,* Mar. 4, 1987.

*Primary Examiner*—David Hudspeth
*Assistant Examiner*—Scott A. Ouellette
*Attorney, Agent, or Firm*—Steven F. Caserza; Lee Patch; Michael Glenn

[57] ABSTRACT

A programmable logic device is constructed having a novel architecture. A plurality of control input signals are applied to a programmable mapping array in order to generate control functions for data path gating, latching, or modification. The programmable control functions provide flexibility to the designer, while the fixed data path logic is independent of the programmable array. The logic array and data path logic are fabricated on the same integrated circuit, therefore obviating the need for input/output buffers which would be necessary if the device were constructed utilizing discrete components. This enhances the performances of the device. Since the data path does not travel through the array, its performance is not affected by the programmability. If desired, the programmable array can be formed of mask programmable devices, fused programmable devices, or register based circuitry, for example, using RAM cells.

19 Claims, 12 Drawing Sheets

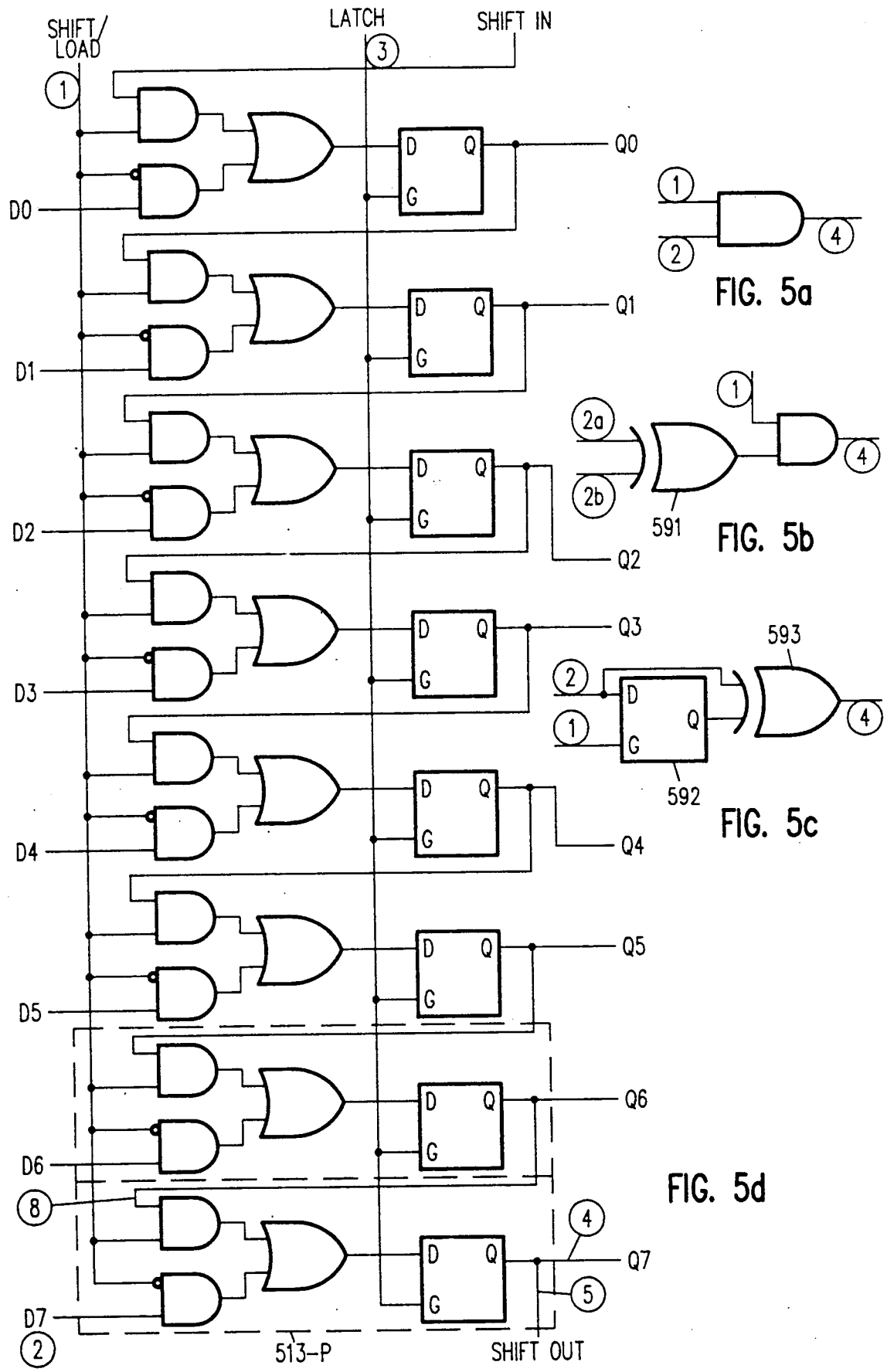

REGISTER FILE WITH PROGRAMMABLE CONTROL, DECODE AND/OR DATA MANIPULATION

BACKGROUND

This invention pertains to programmable logic devices (PLDs) in register and data path control operations.

Programmable devices are well known in the prior art and may be simply illustrated by the schematic diagram of FIG. 1. In FIG. 1, input bus 101 receives a plurality of input signals on leads 101-1 through 101-N. These input signals are inverted in order to form true and complement signals on leads 102-1 through 102-N and 103-1 through 103-N, respectively. Selected ones of these true and complement input signals are applied to the input leads of AND gates 104-1 through 104-M. This may be accomplished either by using a programming mask during the fabrication of a particular programmable logic device, or by fabricating a programmable logic device having a plurality of fuses which may be either programmed in order to form a connection between an input lead of a AND gate 104-1 through 104-M or left unprogrammed in order to avoid such a connection. The output leads of AND gates 104-1 through 104-M are selectively connected (again, for example by a programming mask or by the use of fuses) to selected ones of the input leads of OR gates 105-1 through 105-P. The output signals from OR gates 105-1 through 105-P may either be inverted or not, with resulting signals serving as the output signals of the programmable logic device.

In an alternative type of prior art PLD, connections between true and complement input signals and the input leads of AND gates 104-1 through 104-M remain programmable, but the connection between the output leads of AND gates 104-1 through 104-M are connected in a fixed pattern to the input lead of OR gates 105-1 through 105-P. While this alternative type of prior art PLD reduces the number of possible interconnections, it generally provides higher performance and, depending on the programming technique used, possibly simpler to program to perform a desired task. The functionality of this type of prior art PLD is similar to discrete devices connected to perform the same task, but provide better performance since the components are formed as a single integrated circuit. The performance of such prior art PLD's are comparable to custom integrated circuits designed and fabricated to perform similar functions, but such custom integrated circuits are not user programmable and are very expensive and time consuming to design.

Such a typical prior art programmable logic array is described in U.S. Pat. No. 3,949,370 and is used in order to provide addresses as a result of a code-to-control store address transformation. Address data is written into registers via the programmable logic array.

U.S. Pat. No. 4,482,953 describes a programmable logic array (PLA) used in a microprocessor. The PLA stores microcoded instruction sequences in order to test internal registers. The PLA does not provide dedicated input data to the registers, but rather the registers are loaded through the PLA.

U.S. Pat. No. 4,641,278 describes a register select circuit controlling specialized function circuitry contained within the register file. This select circuit is fixed, and not programmable, and is not arranged in an array.

U.S. Pat. No. 4,803,622 described the use of a PLA to store a program which controls a service table defining the operations of a bus sequencer. However, this PLA does not include a register file for control or decode circuitry.

U.S. Pat. No. 4,829,425 describes the use of a PLA bus sequencer similar to that described in the aforementioned U.S. Pat. No. 4,803,622.

SUMMARY OF THE INVENTION

In accordance with the teachings of this invention, programmable logic device is constructed having a novel architecture. In accordance with this invention, a plurality of control input signals are applied to a programmable logic array in order to generate control functions for data path gating, latching, or modification. The programmable control functions provide flexibility to the designer, while the fixed data path logic provides high performance independent of the programmable array. The control function can also include fixed decode functions, latched outputs, and the like, as is well known in connection with prior art PLAs. The logic array and data path logic are fabricated on the same integrated circuit, therefore obviating the need for input/output buffers which would be necessary if the device were constructed utilizing discrete components. This enhances the performance of the device. Since the data path does not travel through the array, its performance is not affected by the programmability. If desired, the programmable array can be formed of mask programmable devices, fused programmable devices, or register based circuitry, for example, using RAM cells.

In one embodiment of this invention, one control function forms the latch, or write enable for a storage element, while another gates the output, forming the read enable for the storage element. The latch can be level or edge sensitive, and the gate can be a transmission gate or a logic gate.

In an alternative embodiment, multiple storage elements share the same control functions, forming an X-bit register across the "data path".

In another embodiment, multiple control functions enable multiple storage elements sharing the same data input and output, forming a file of Y storage elements.

In another embodiment, both an X-bit register across the data path and a file of Y storage elements are used in order to form a file of Y X-bit storage elements, serving as a single port register file.

An alternative embodiment includes multiple control functions enabling independent inputs and outputs to the same storage element, forming a Z-port register.

Another embodiment replaces the storage element with a simple combinatorial logic function taking input data and control functions as its inputs and output data as its output. This is used, for example, to create "mask" or "routing" (multiplexing) functions.

An alternative embodiment replaces the storage element with more complex logic, combining input data and control functions with input or output data from other elements to generate arithmetic (count, shift, add, etc.) functions.

Additional control functions can be used to modify the existing functions and a plurality of logic elements can be cascaded or combined in any manner in order to provide complex functions.

BRIEF DESCRIPTION OF THE DRAWINGS

FIG. 5a is a schematic diagram of one embodiment of a logic/storage function element of FIG. 5 which serves as a simple buffer.

FIG. 5b depicts one embodiment of a logic/storage function element of FIG. 5 which allows comparison of two input bits.

FIG. 5c is one embodiment of a logic/storage function element of FIG. 5 which allows the comparison of 2 serially loaded bits.

FIG. 5d depicts an alternative embodiment of FIG. 5 in which logic/storage element includes a register for shifting data which can be loaded or read in parallel.

DETAILED DESCRIPTION

Single Port Register

Figure 1:
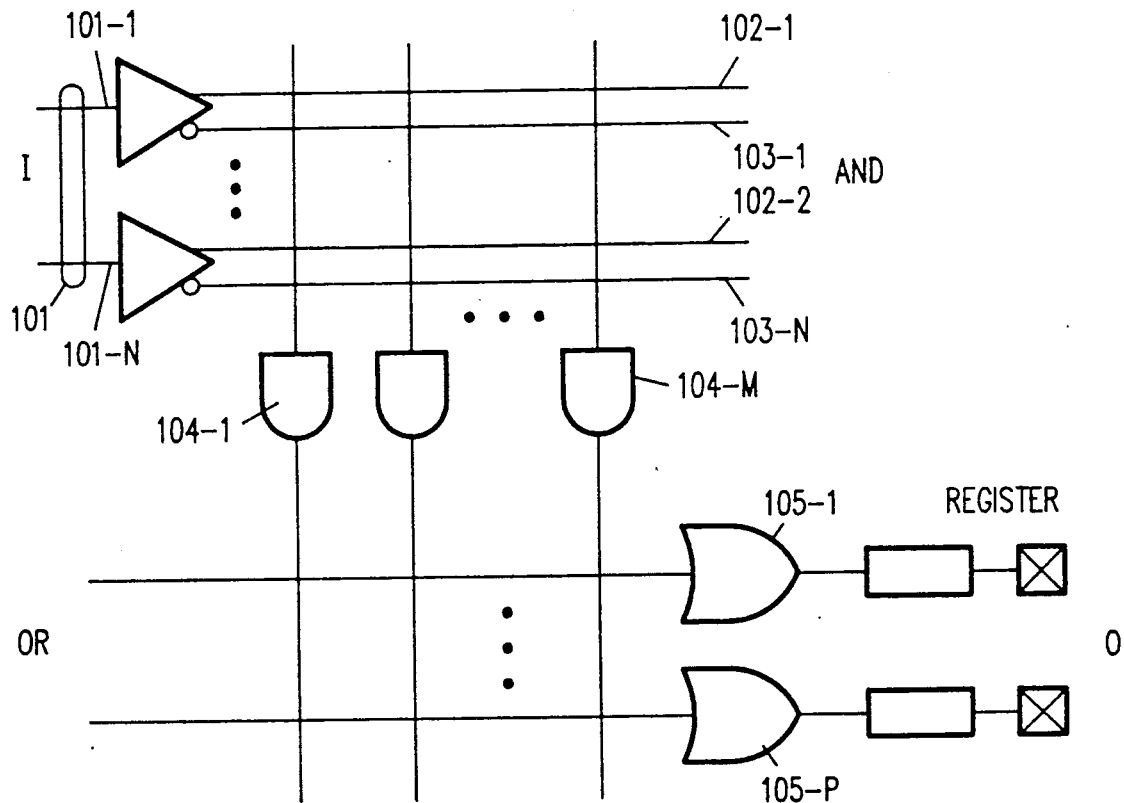
FIG. 1 is a schematic diagram of a typical prior art programmable device.
Figure 2A:
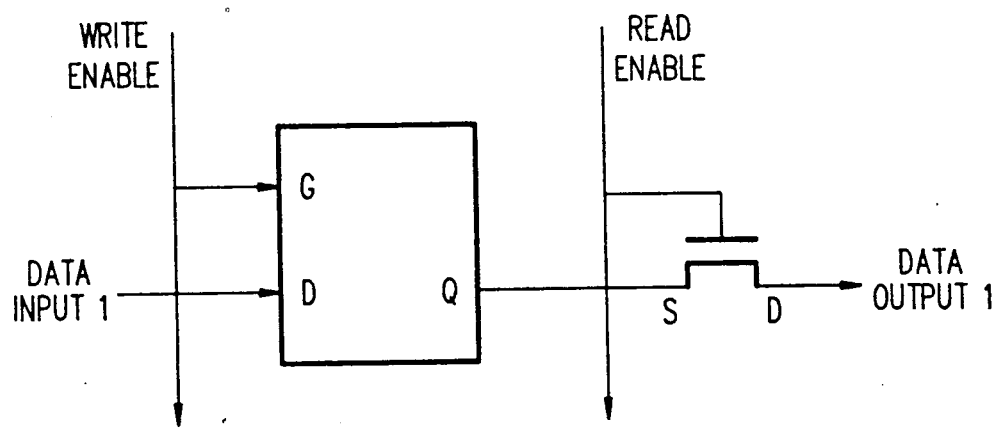
FIG. 2a depicts an alternative embodiment of FIG. 2 in which data output NAND gates are replaced with transmission gates.
Figure 2:
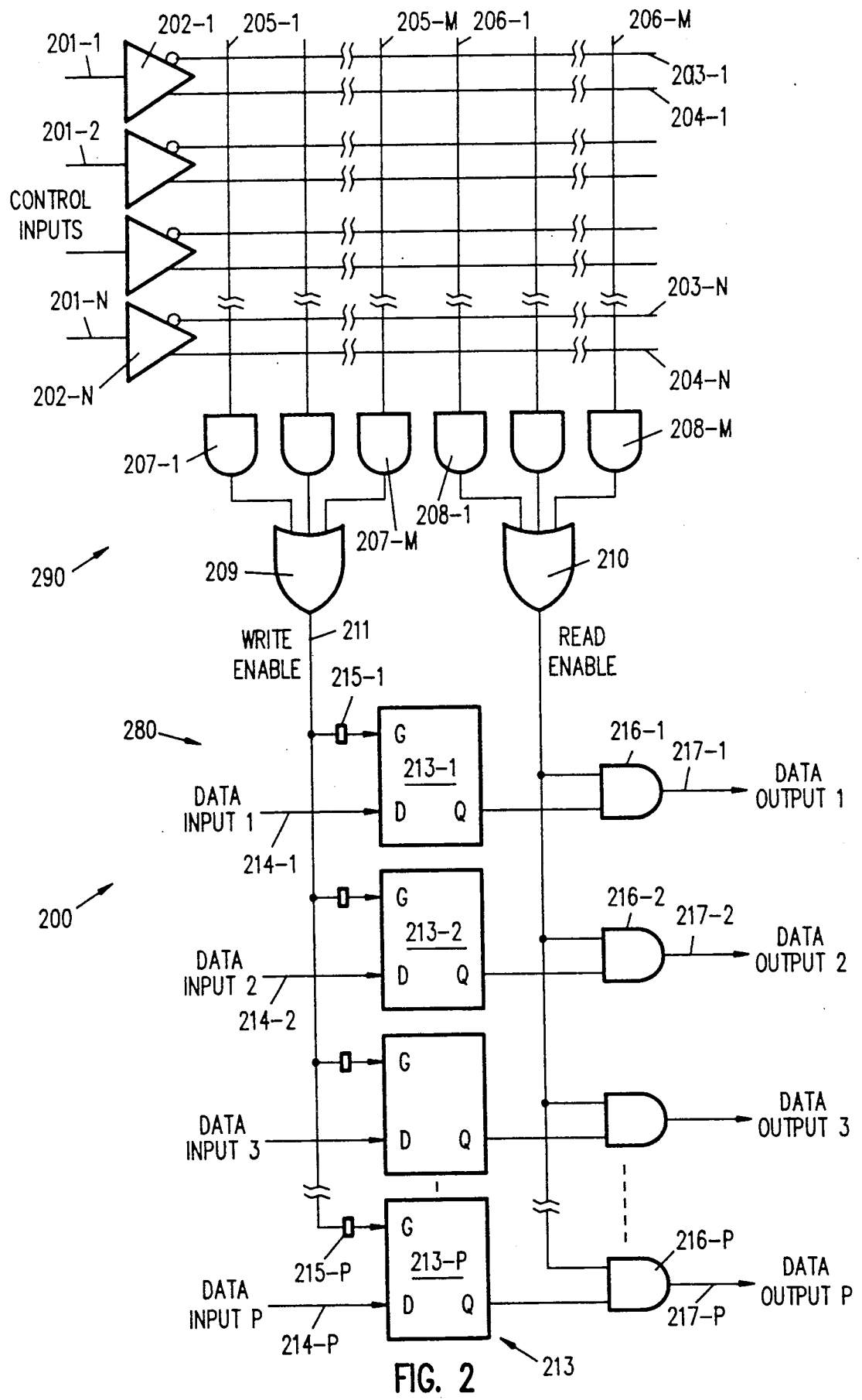
FIG. 2 is a schematic diagram of one embodiment of a PLD construction in accordance with the teachings of this invention.

FIG. 2 is a schematic diagram of one embodiment of a PLD constructed in accordance with the teachings of this invention, constructed as a single port register. A plurality of control input signals are applied to control input leads 201-1 through 201-N. These input signals are buffered by buffers 202-1 through 202-N in order to provide true and complement control input signals on leads 204-1 through 204-N and 203-1 through 203-N, respectively.

A plurality of AND gates 207-1 through 207-M are used to provide signals resulting from their logical operation on a selected set of the true and complement input signals available on leads 203-1 through 203-N and 204-1 through 204-N. Each AND gate 207-1 through 207-M is shown as having an input bus 205-1 through 205-M. It is readily understood by those of ordinary skill in the art that this drawing illustrates a plurality of input signals for each AND gate, and the ability for the user to connect each input lead to a desired one of leads 203-1 through 203-N and 204-1 through 204-N. Thus, each AND gate 207-1 through 207-M can perform a logical AND function on any combination of a true and complement versions of the control input signals, depending of course upon the number of input leads associated with each such AND gate. The output signals from AND gates 207-1 through 207-M are applied to the input leads of OR gate 209 whose output signal serves, in this embodiment, as a write enable signal made available on lead 211. If desired, OR gate 209 is programmable, for example, utilizing a mask programmable circuit, fuse programmable circuit, or a register based array. The write enable signal is applied to the gating input leads of register 213 which contains register bits 213-1 through 213-P. The data input leads of register bits 213-1 through 213-P are connected to data input leads 214-1 through 214-P, respectively.

In this manner, register bits 213-1 through 213-P load input data from leads 214-1 through 214-P, respectively, upon control of the write enable signal generated by control input signals applied to control input leads 201-1 through 201-N without delaying the data input path. Since a write enable signal 211 is generated as a result of the specific programming of AND gates 207-1 through 207-M, great flexibility is provided in the ability to generate a write enable signal as a function of control input data.

Of importance, register bits 213-1 through 213-P can be either level sensitive or edge triggered, synchronous or asynchronous, as desired.

Once input data is loaded into register bits 213-1 through 213-P, it is available on the data output loads of the register bits until such time as new data is loaded. This stored data is available during a read operation for application to other circuitry, or to be output to other integrated circuits.

Alternatively, as shown in the embodiment of FIG. 2, read enable circuitry is provided in order to mask the output data from register bits 213-1 through 213-P to output leads 217-1 through 217-P. In the embodiment of FIG. 2, this read enable circuitry is simply a plurality of AND gates 216-1 through 216-P, each having one input lead connected to the data output lead of an associated one of register bits 213-1 through 213-P, and a second input lead connected to read enable lead 212, with its output lead serving as one of output leads 217-1 through 217-P of the data output bus. The read enable signal is generated in a similar manner as the write enable signal, although naturally a different set of programming criteria would be used to generate the read enable signal.

In an alternative embodiment of this invention, NAND gates 216-1 through 216-P are replaced with transmission gates, as depicted in FIG. 2a. The transmission gate may comprise, for example, an MOS transistor having its gate connected to the read enable line, and its source lead connected to the data output lead of its associated register bit and its drain lead connected to the data output bus.

While the embodiment of FIG. 2 shows a single write enable signal provided on write enable lead 211 for application to a plurality of register bits 213-1 through 213-P, in an alternative embodiment of this invention, a plurality of write enable signals are generated for application to different ones or different subsets of register bits 213-1 through 213-P. In this manner, even greater flexibility is provided in that a number of different programmable control functions used to determine when data is to be latched into various register bits.

Similarly, while the embodiment of FIG. 2 shows a single read enable signal being made available on read enable line 212, in an alternative embodiment of this invention, a plurality of read enable signals are provided in a similar fashion, providing a number of different programmable control functions, in order to enable different read enable signals to be applied to different ones or different subsets of data output masks 216-1 through 216-P.

In an alternative embodiment of this invention, regardless of whether one or more write enable signals are used in conjunction with register bits 213-1 through 213-P, a plurality of write enable masking circuits 215-1 through 215-P are used in order to selectively mask the write enable signal for application to selected ones of register bits 213-1 through 213-P. In one embodiment of this invention, each write enable mask circuit 215-1 through 215-P is formed as an AND gate, similar to output mask circuits 216-1 through 216-P, and additional array elements are included in array 290 in order to provide one or more write enable masking signals for controlling all, individual ones, or specified subsets of write enable masking circuits 215-1 through 215-P.

In an alternative embodiment of this invention, write enable masking circuits 215-1 through 215-P are controlled to provide one of three possible states: first, pass the write enable signal associated with the register bit unchanged; second, mask the write enable signal associated with the register bit so that the register is never write enabled; and thirdly, provide a write enable signal to the associated register bit regardless of the state of the write enable signal generated by array 290, thereby providing a transparent buffer.

Figure 2B:
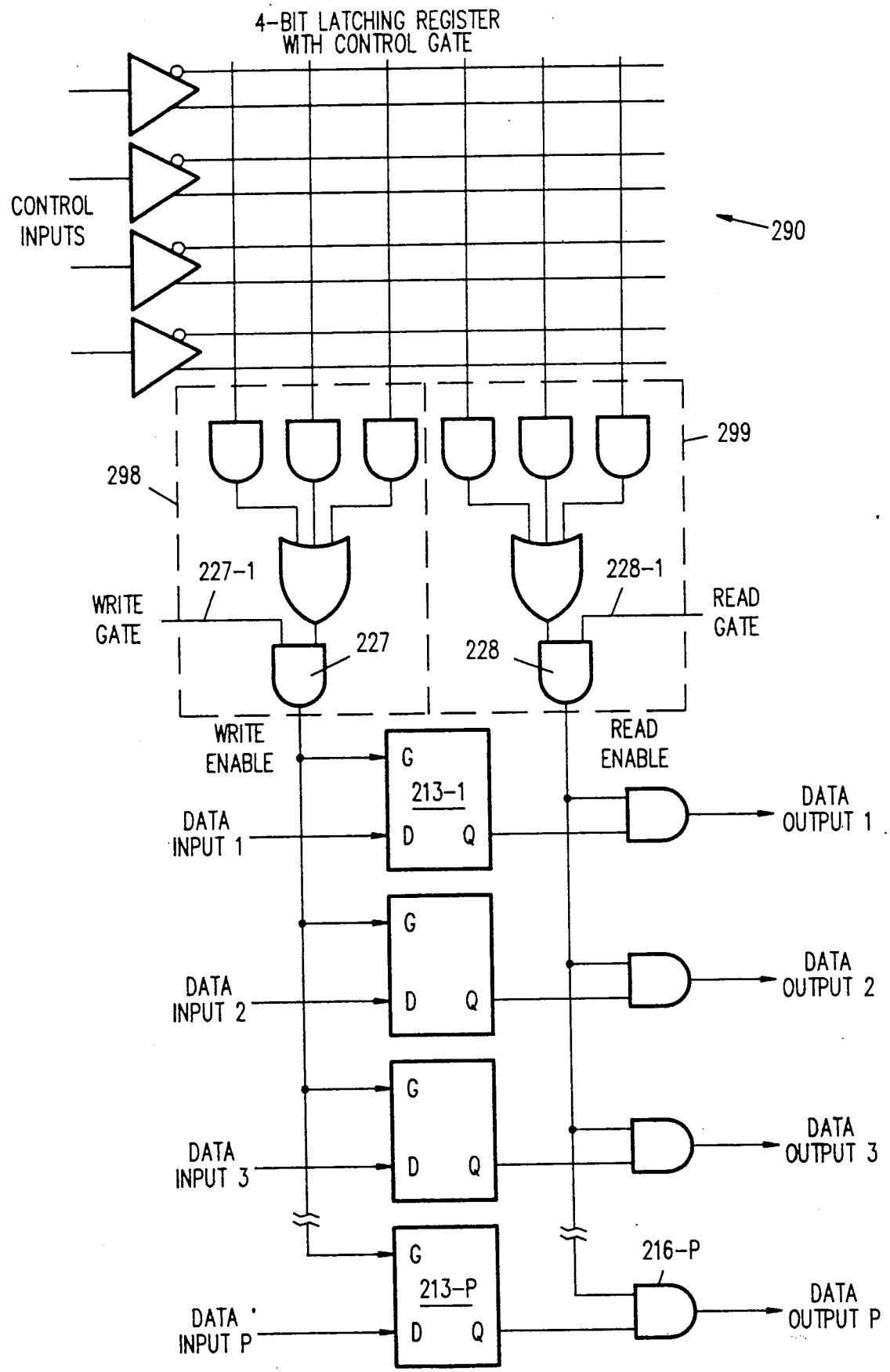
FIG. 2b is an alternative embodiment of FIG. 2 which includes read and write enable gates.

FIG. 2b depicts an alternative embodiment of the circuit of FIG. 2 which includes write gate 227, which receives a write enable gating signal on lead 227-1. This serves to allow selective write enable of register bits 213-1 through 213-P. Similarly, read enable gate 228 receives a read enable gating signal on lead 228-1, allowing selective read enable of register bits 213-1 through 213-P. Naturally, either one or both of write enable gate 227 and read enable 228 may be used. Furthermore, either one or both of the write enable and read enable functions performed by subcircuits 298 and 299, respectively, can be implemented utilizing more complex logic, including any desired number of input signals for generating the read enable and write enable signals.

Figure 2C:
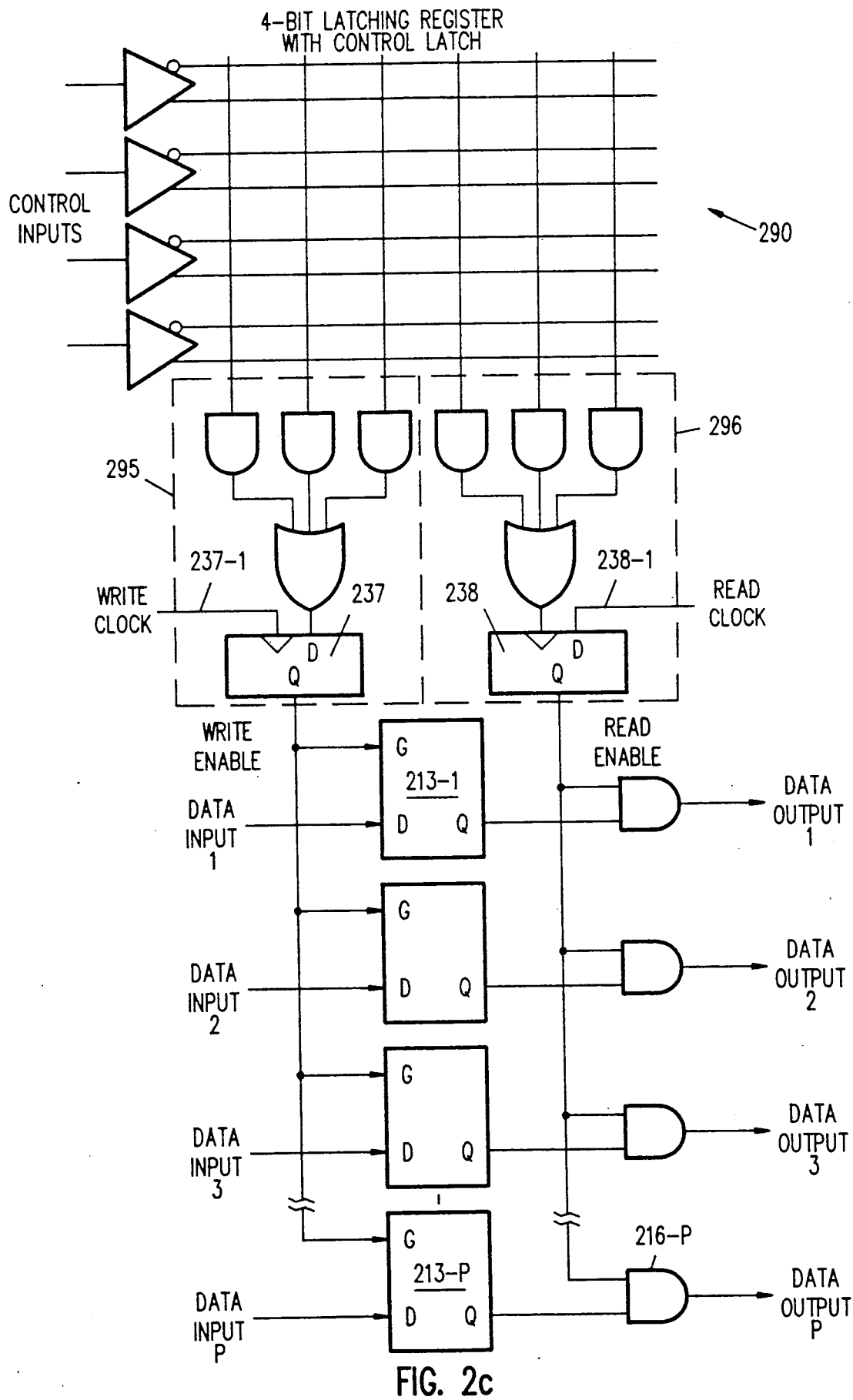
FIG. 2c is an alternative embodiment of FIG. 2 which includes read and write enable latches.

FIG. 2c depicts an alternative embodiment of the circuit of FIG. 2 which includes write enable latch 237, which receives a write clock signal on lead 237-1 in order to latch a read enable bit from control signal array 290 defining whether register bits 213-1 through 213-P are to be write enabled. Similarly, read enable latch 238 receives a read enable clock signal on lead 238-1, and serves to latch a write enable bit from control signal array 290 indicating whether register bits 213-1 through 213-P are to be read enabled. Naturally, either one or both of write enable latch 237 and read enable latch 238 may be used. Furthermore, the use of write enable and read enable latches can be combined with additional logic in order to provide any desired type of read enable and write enable functions performed by subcircuits 295 and 296, respectively.

Multiple Port Register

Figure 3:
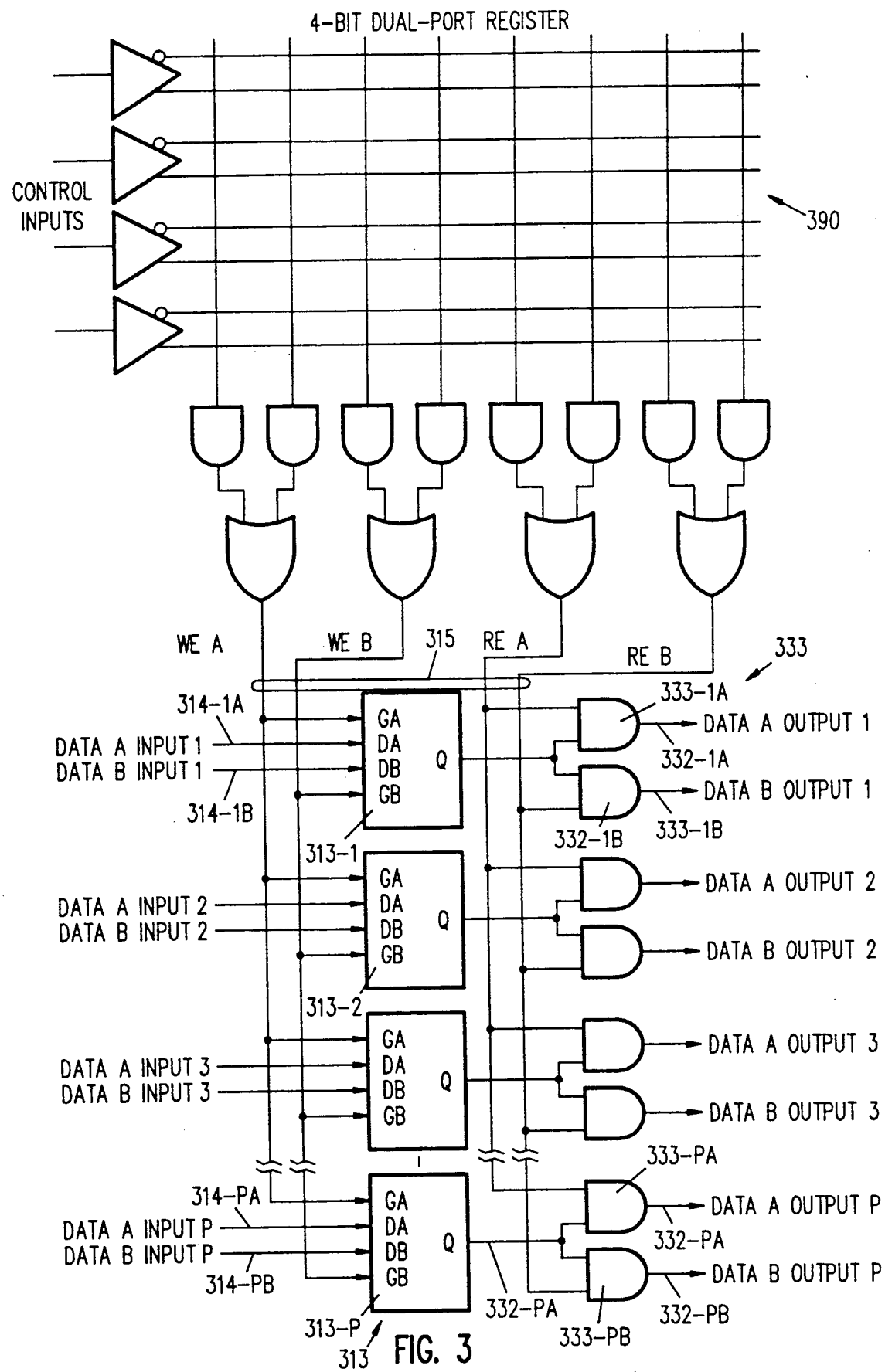
FIG. 3 is a schematic diagram depicting one embodiment of a multiple port register constructed in accordance with the teachings of this invention.

FIG. 3 is a schematic diagram depicting one embodiment of a multiple port register constructed in accordance with the teaching of this invention. The multiple port register of FIG. 3 includes control signal array 390 which receives a plurality of control input signals and is programmed in order to provide a plurality of control output signals in response thereto. As shown in FIG. 3, control signal array 390 provides output signals on control bus 315 which includes the following control signals:

Register Write Enable A (WE A)
Register Write Enable B (WE B)
Register Read Enable A (RE A)
Register Read Enable B (RE B)

Thus, the embodiment of FIG. 3 is a dual port register including input port A, output port A, input port B, and output port B, each input and output port including P input or output leads, respectively.

The embodiment of FIG. 3 includes register 313 which is P bits wide and includes register bits 313-1 through 313-P, each receiving a corresponding input data signal (DA) from input port A and a corresponding input data signal (DB) from input port B. Each register bit 313-1 through 313-P also includes enable input A (GA) which receives the write register A enable (WE A) signal from control signal array 390, the enable input B (GB) which receives the write register B enable (WE B) signal from control signal array 390. Registers 313-1 through 313-P also include a Q output lead which provides the data output signal to the selected one of the A and B output leads associated with that register bit, as selected by read A enable circuitry 333-1a through 333-Pa and read B enable circuitry 333-1b through 333-Pb, which receive the read register A enable (RE A) and read register B (RE B) enable signals, respectively, from control signal array 390.

Figure 3A:
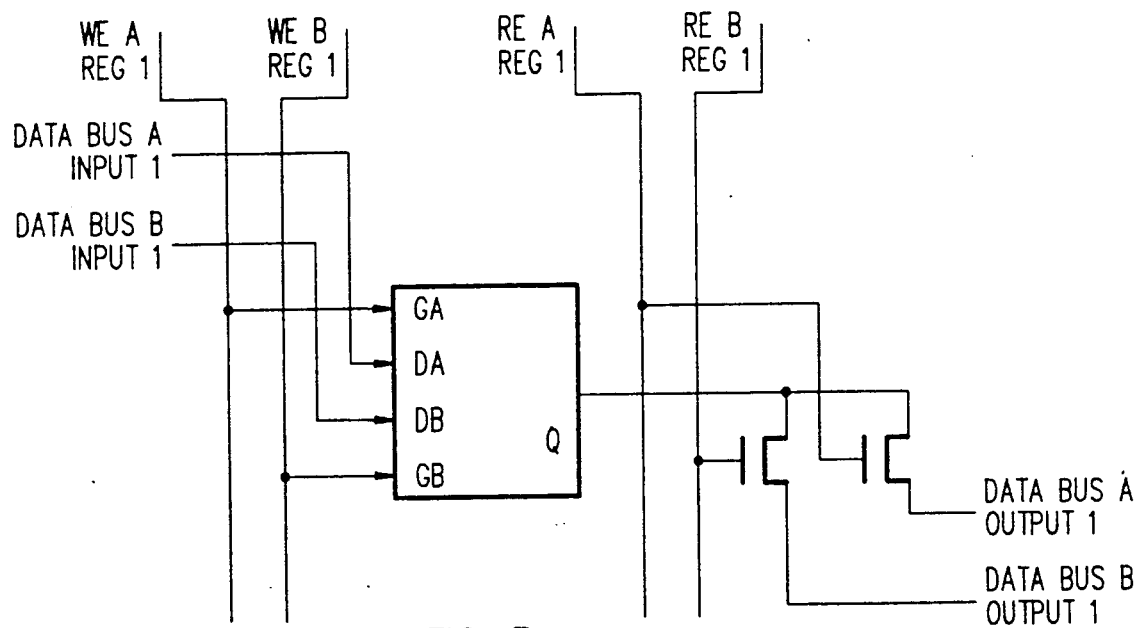
FIG. 3a depicts an alternative embodiment of FIG. 2 in which data output NAND gates are replaced with transmission gates.

Naturally, it will be readily appreciated by those of ordinary skill in the art in light of the teachings of this invention that the multiple port register of FIG. 3 can be expanded with equal applicability to provide any desired number of ports. The number of write ports and the number of read ports need not be equal. Furthermore, it will be appreciated that read enable circuitry 333 can be implemented in other manners, for example, by utilizing a plurality of transmission gates as depicted in the embodiment of FIG. 3a. Any number of single port implementations constructed in accordance with the teachings of this invention, or indeed combinations of various types of single port implementations constructed in accordance with the teachings of this invention, may be conveniently combined in order form a device having a plurality of read and/or write ports.

Multiple Port Register File

Figure 4A:
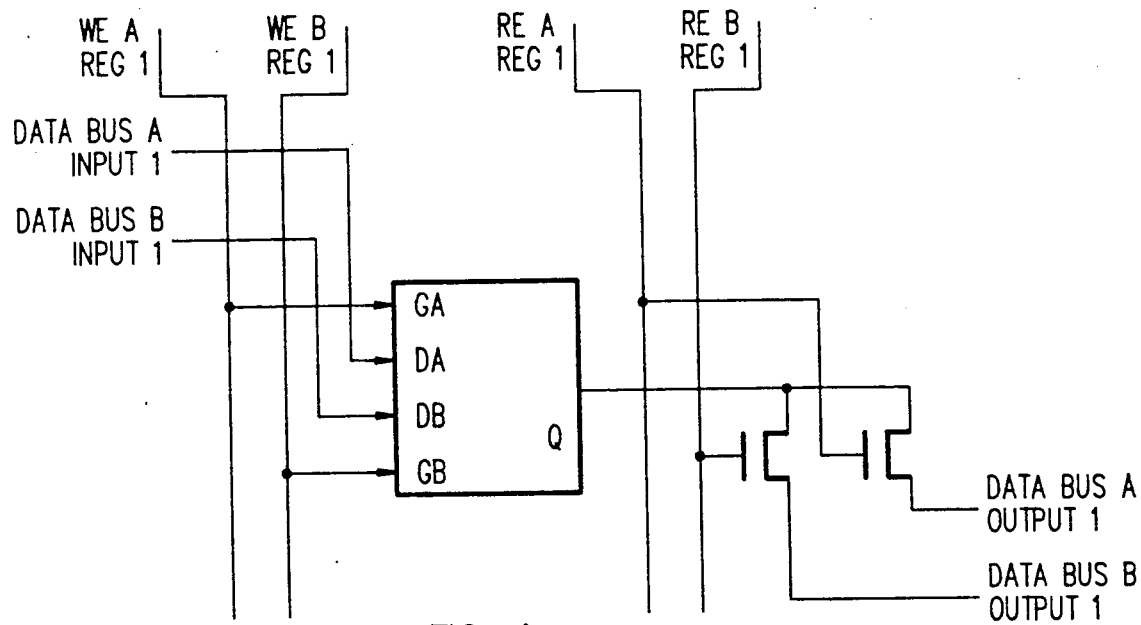
FIG. 4a depicts an alternative embodiment of FIG. 2 in which data output NAND gates are replaced with transmission gates.
Figure 4:
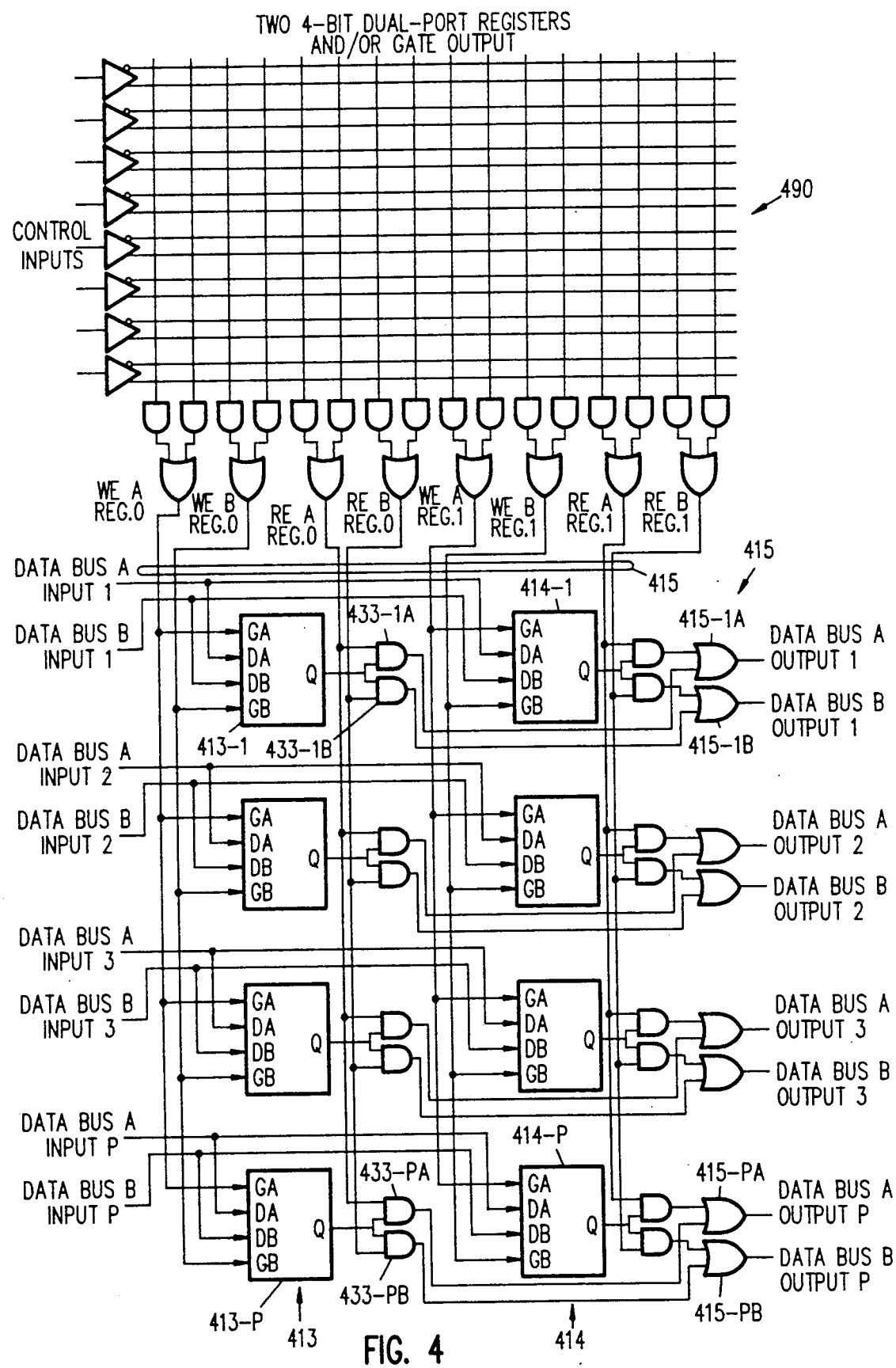
FIG. 4 is a schematic diagram of one embodiment of a multiple port register file constructed in accordance with the teachings of this invention.

FIG. 4 is a schematic diagram of one embodiment of this invention which is a multiple port register file, i.e. a circuit including a plurality of input and output ports and a plurality of registers, each being P bits wide and receiving independent read and write enable control signals from control signal array 490. The multiple port register of FIG. 4 includes control signal array 490 which receives a plurality of control input signals and is programmed in order to provide a plurality of control output signals in response thereto. As shown in FIG. 4, control signal array 490 provides output signals on control bus 415 which includes the following control signals for both register 0 and register 1:
Register Write Enable A (WE A)
Register Write Enable B (WE B)
Register Read Enable A (RE A)
Register Read Enable B (RE B)

Thus, the embodiment of FIG. 4 provides two P-bit dual port registers, each register including input port A, output port A, input port B, and output port B, each input and output port including P input or output leads, respectively.

The embodiment of FIG. 4 includes register 413 which is P bits wide and includes register bits 413-1 through 413-P, each receiving a corresponding input data signal (DA) from input port A and a corresponding input data signal (DB) from input port B. Each register bit 413-1 through 413-P also includes enable input A (GA) which receives the write register A enable (WE A) signal from control signal array 490, the enable input B (GB) which receives the write register B enable (WE B) signal from control signal array 490. Registers 413-1 through 413-P also include a Q output lead which provides the data output signal to the selected one of the A and B output leads associated with that register bit, as selected by read A enable circuitry 433-1a through 433-Pa and read B enable circuitry 433-1b through 433-Pb, which receive the read register A enable (RE A) and read register B enable (RE B) enable signals, respectively, from control signal array 490. Register 414 operates in a similar fashion as register 413.

In the dual-port embodiment shown in FIG. 4, the output signals from the selected output port of register 413 are ORed with the selected output signals from register 414 by OR gates 415-1a through 415-Pa and 415-1b through 415-Pb. In an alternative embodiment of this invention, OR gate array 415 is replaced with a plurality of transmission gates, as depicted in FIG. 4a, in order to select the appropriate data for application to each output data bus. In another embodiment of this invention (not shown) the output signals from registers 413 and 414 are applied to separate output leads. Alternatively, the output signals are selected in any other desired manner, for example, by utilizing multiplexors.

Naturally, it will be readily appreciated by those of ordinary skill in the art in light of the teachings of this invention that the multiple port register file of FIG. 4 can be expanded with equal applicability to provide any desired number of ports or register sets.

Alternative Data Path Logic Functions

Figure 5:
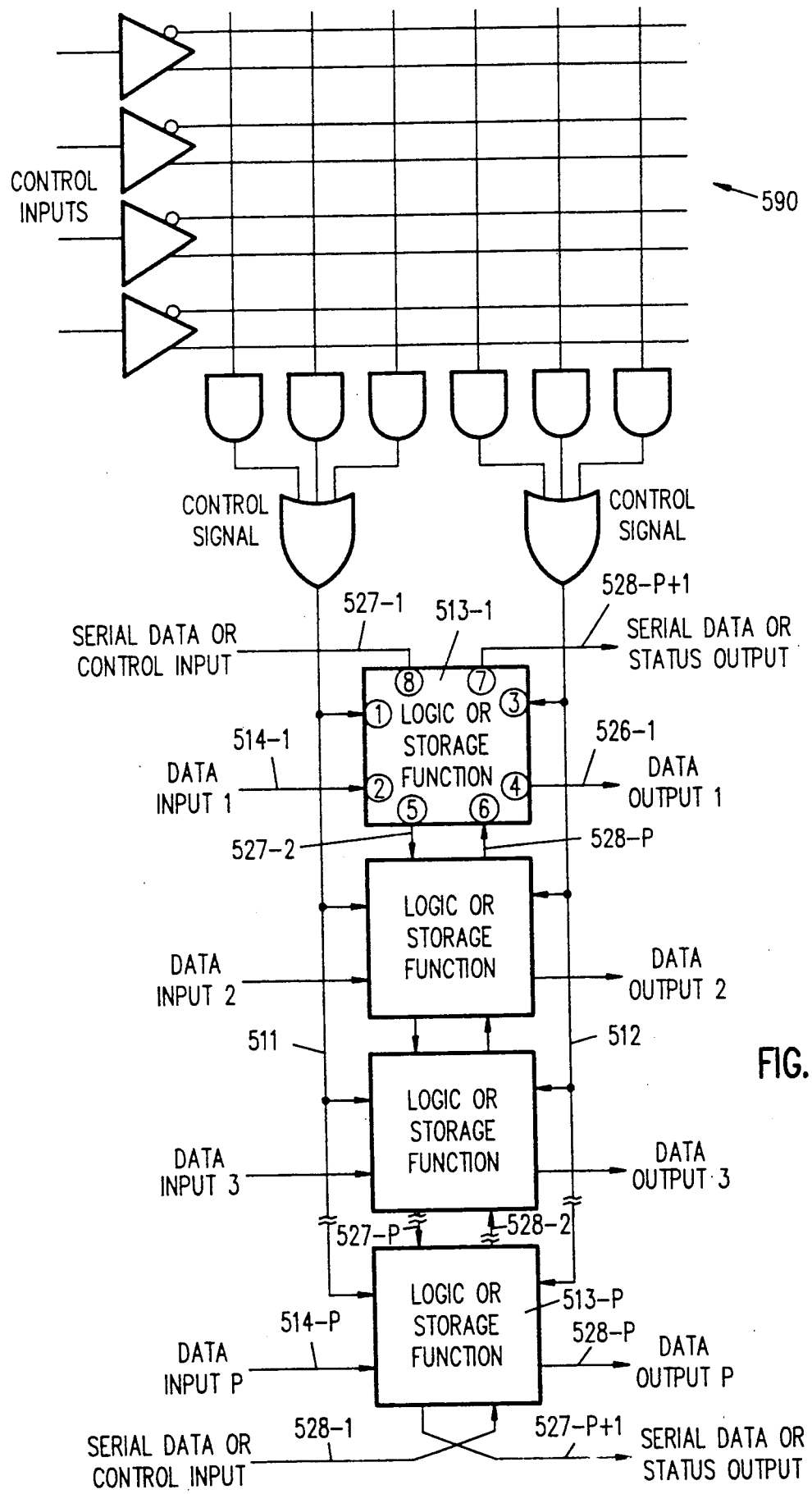
FIG. 5 is a schematic diagram of one embodiment of this invention utilizing a plurality of general logic/storage function elements.

FIG. 5 is a schematic diagram of one embodiment of this invention in which register 213 of the embodiment of FIG. 2 is replaced by a plurality of general logic/storage function elements 513-1 through 513-P. Each logic/storage function element 513-1 through 513-P has data input leads 514-1 through 514-P, data output leads 526-1 through 526-P, a first set (527-1 through 527-P+1) and a second set (528-1 through 528-P+1) of serial data input/output leads or control input/status output leads, which serve to connect logic/storage function elements 513-1 through 513-P in a serial fashion. Each logic/storage function element 513-1 through 513-P also includes a first global control signal input lead 511 and a second global control signal input lead 512. Naturally, it will be readily appreciated by those of ordinary skill in the art in light of the teachings of this invention that any desired number of data input, data output, serial data, control input, status output, and global control signal leads may be utilized in each logic/storage function element 513-1 through 513-P, or that different numbers may be associated with different ones of logic/storage function elements 513-1 through 513-P.

Logic/storage function element 513-1 shows its eight leads labeled as 1 through 8 for ease in understanding how the specific examples of logic/storage function elements shown in FIGS. 5a through 5g are implemented in the embodiment of FIG. 5.

In one embodiment, logic/storage function elements 513-1 through 513-P comprise simple buffers which are controlled by one or more global control signals, as depicted in FIG. 5a. This embodiment provides programmable control of a unidirectional buffer.

In another embodiment, as depicted in FIG. 5b, each logic/storage function elements 513-1 through 513-P includes two data input leads 2a and 2b, each serving as an input lead similar to lead 2 of logic/storage function element 513-1 of FIG. 5. Exclusive OR gate 591 allows comparison of two input bits applied to input leads 2a and 2b and provides the result on data output lead 4 of the logic/storage function element.

In an alternative embodiment, as depicted in FIG. 5c, a single data input lead 2 is used with register 592 contained within logic/storage function element such that a first bit to be compared is loaded into register 592 and compared with data subsequently input on data input lead 2 by exclusive OR gate 593.

FIG. 5d depicts an alternative embodiment of this invention, in which each logic/storage element includes a register capable of storing data which is loaded in parallel to the logic/storage elements. This data is capable of being shifted to adjacent logic/storage function elements under control of the global control signals. In this manner, this embodiment serves as a programmable parallel loadable and readable shift register.

Figure 5E:
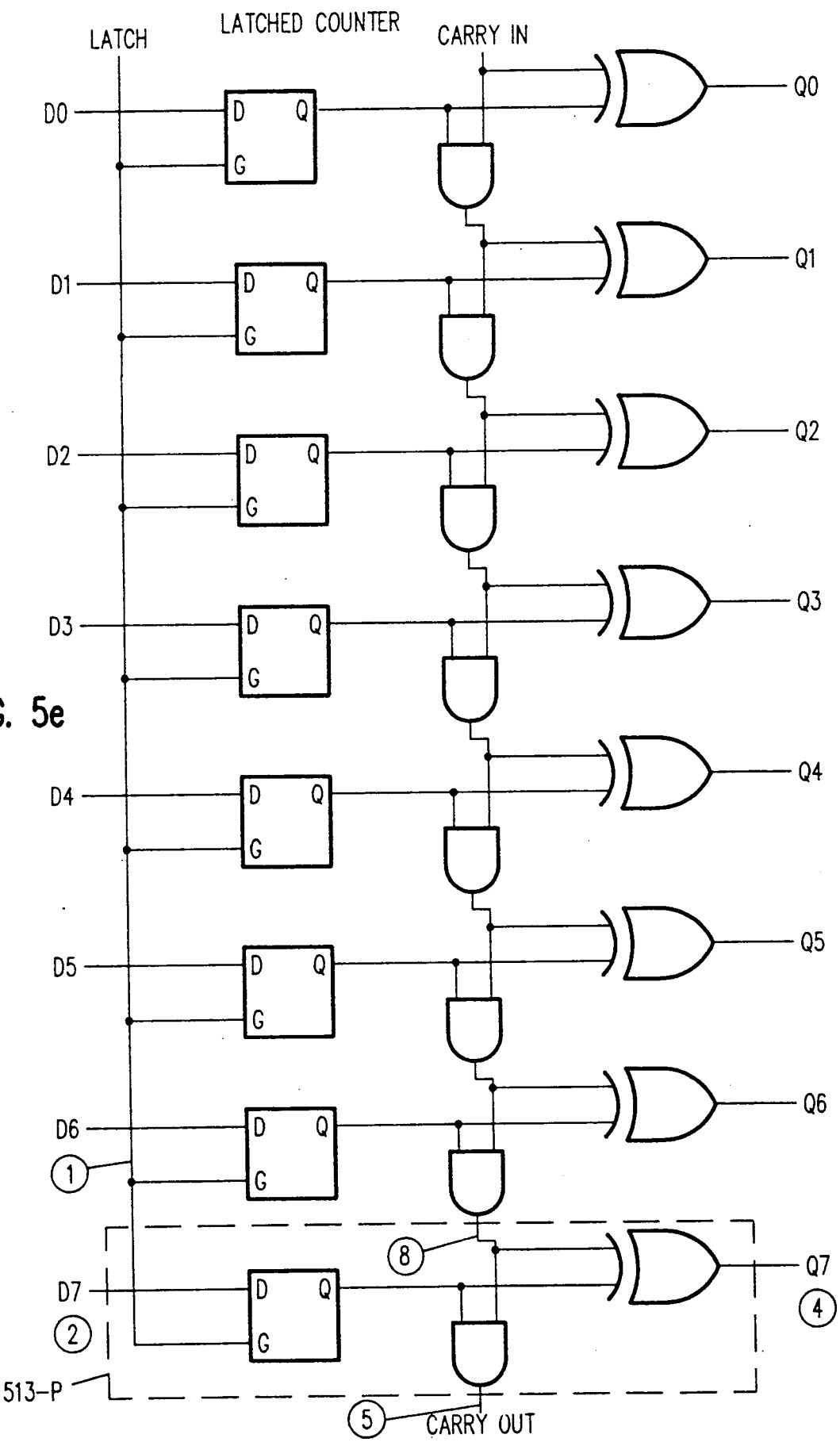
FIG. 5e depicts an alternative embodiment of a logic/storage function element of FIG. 5 which allows the embodiment of FIG. 5 to function as a latched ripple-carry counter.

FIG. 5e depicts an alternative embodiment of logic/storage elements suitable for use in the embodiment of FIG. 5. The logic/storage element of FIG. 5e allows the embodiment of FIG. 5 to serve as a latched counter with ripple-carry output.

Figure 5F:
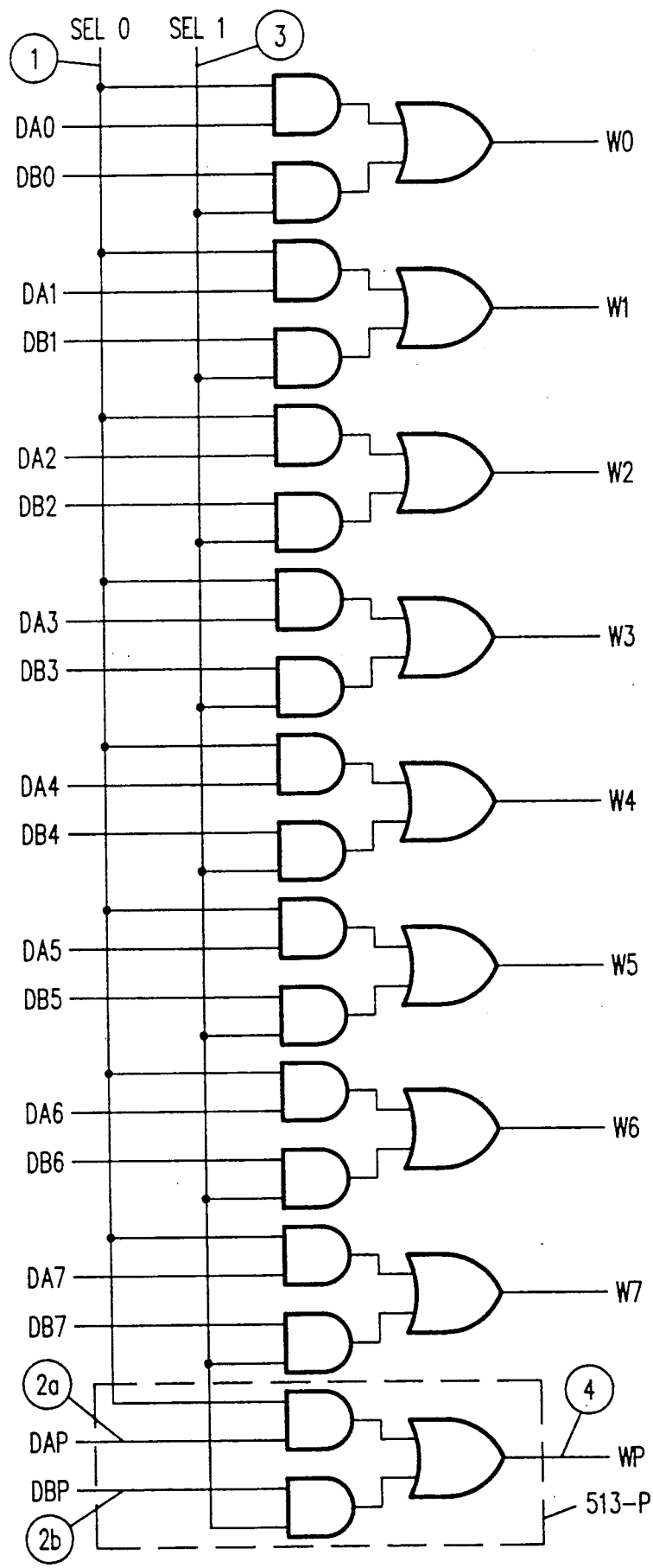
FIG. 5f depicts one embodiment of a logic/storage function element of the embodiment of FIG. 5 which allows the embodiment of FIG. 5 to function as a 2:1 multiplexor.

FIG. 5f depicts an alternative embodiment of logic/storage elements constructed in accordance with teachings of this invention which allows the embodiment of FIG. 5 to serve as a 2:1 multiplexor.

Figure 5G:
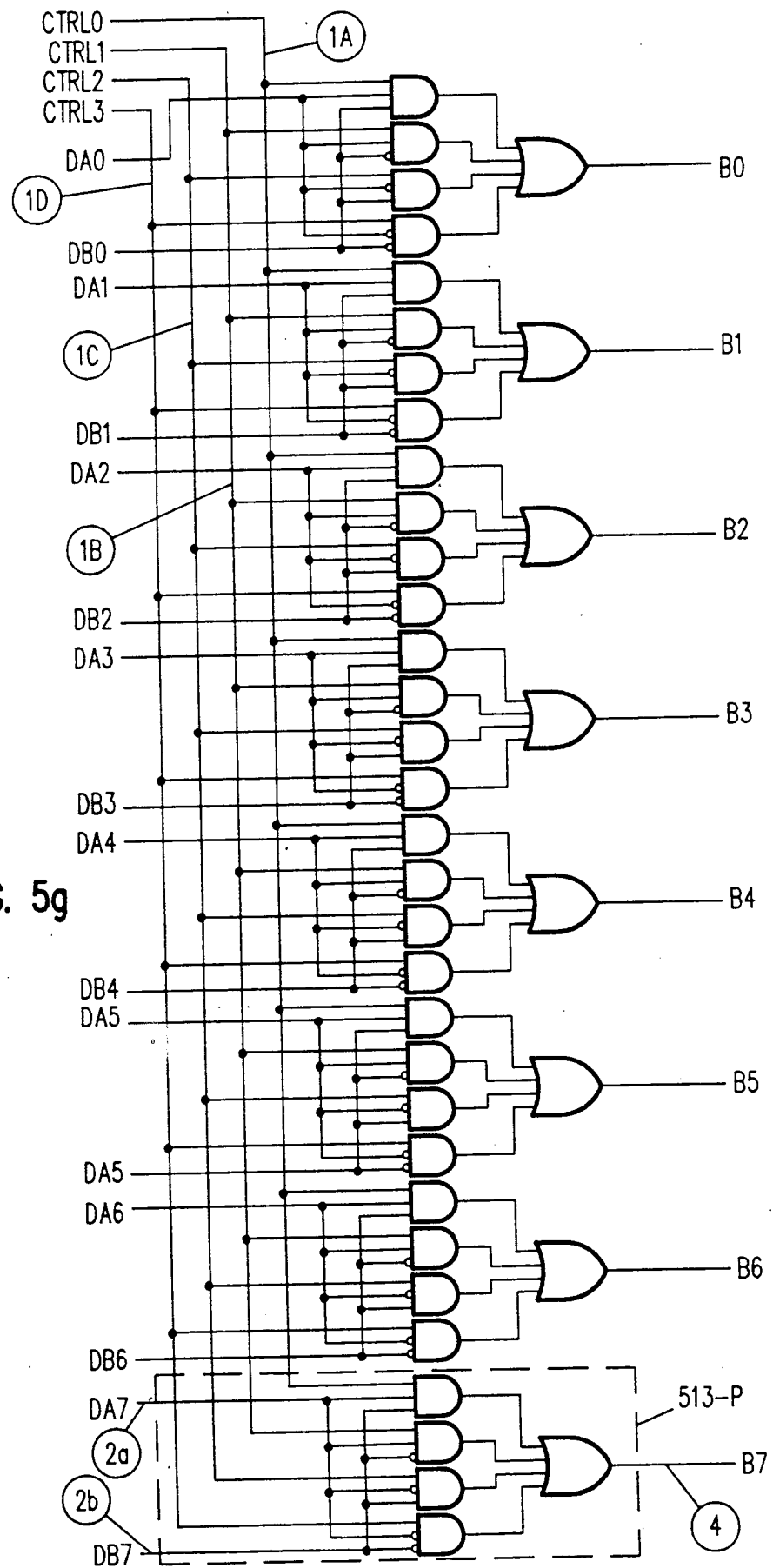
FIG. 5g depicts one embodiment of a logic/storage function element suitable for use with the embodiment of FIG. 5, which serves as a universal, two-input logic element.

FIG. 5g depicts logic/storage element suitable for use in the embodiment of FIG. 5. Each logic/storage element of FIG. 5g serves as a universal, 2 input logic element which provides a logical operation on the 2 input signals received on input leads 2a and 2b in accordance with the control signals provided on control leads 1a through 1d, according to the following Truth Table.

| TRUTH TABLE | | | | |
|---|---|---|---|---|
| C0 | C1 | C2 | C3 | B |
| 0 | 0 | 0 | 0 | 0 |
| 0 | 0 | 0 | 1 | /A*/B |
| 0 | 0 | 1 | 0 | /A*B |
| 0 | 0 | 1 | 1 | /A |
| 0 | 1 | 0 | 0 | A*/B |
| 0 | 1 | 0 | 1 | /B |
| 0 | 1 | 1 | 0 | A*/B+/A*B |

-continued

| TRUTH TABLE | | | | |
|---|---|---|---|---|
| C0 | C1 | C2 | C3 | B |
| 0 | 1 | 1 | 1 | /A+/B |
| 1 | 0 | 0 | 0 | A+B |
| 1 | 0 | 0 | 1 | A•B+/A•/B |
| 1 | 0 | 1 | 0 | B |
| 1 | 0 | 1 | 1 | /A+B |
| 1 | 1 | 0 | 0 | A |
| 1 | 1 | 0 | 1 | A+/B |
| 1 | 1 | 1 | 0 | A+B |
| 1 | 1 | 1 | 1 | 1 |

Although not shown, each of the various embodiments described in this specification can include, if desired, write or control masking circuits similar to write enable masking circuits 115-1 through 115-P of the embodiment of FIG. 2. Alternative embodiments include means for feeding back output signals from the data register to the input of the control array. In fact, any type of logical function can be placed between the output of the data register, the input of the data register, the input of the control array, and the output of the control array in order to derive any desired operating parameters. Such a logical function can include parity generation and checking of the data in the data path. Furthermore, tag bits can be utilized, in which a tag bit register is used in addition to the data register and, if desired, controlled in a manner different than how the data register is controlled.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A logic device comprising:
    a plurality of N control input leads for receiving a plurality of N control input signals, where N is a first positive integer;
    a logic array including means for receiving said plurality of control input signals and providing a plurality of J control output signals as a function of said plurality of input signals, where J is a second positive integer greater than or equal to one;
    a plurality of P data input leads for receiving a plurality of P input data signal, where P is an integer greater than or equal to one;
    a plurality of P data output leads for providing a plurality of P data output signals; and
    data means for providing said plurality of P data output signals as a function of said P data input signals and as controlled by said J control output signals, said data means comprising:
        a plurality of P storage devices, each storage device having a data input lead coupled to an associated one of said data input leads, a data output lead, and a write enable terminal; and
        a plurality of P output control means, each output control means having an input lead coupled to said data output lead of an associated one of said storage devices, an output lead coupled to an associated one of said data output leads, and a read enable lead.

2. A logic device as in claim 1 wherein said J control output signals serve to provide one or more read enable signals, one or more write enable signals, or both.

3. A logic device as in claim 2 wherein one control output signal serves to provide a read enable signal for all of said storage devices.

4. A logic device as in claim 2 wherein one control output signal serves to provide a write enable signal for all of said storage devices.

5. A logic device as in claim 2 wherein said control output signals serve to provide a plurality of read enable signals, each being associated with one of said storage devices.

6. A logic device as in claim 2 wherein said control output signals serve to provide a plurality of write enable signals, each being associated with one of said storage devices.

7. A logic device as in claim 3 wherein one of said control output signals is masked by one or more read enable gating signals in order to provide said read enable signals.

8. A logic device as in claim 5 wherein said control output signals are masked by one or more read enable gating signals in order to provide said read enable signals.

9. A logic device as in claim 4 wherein one of said control output signals is masked by one or more write enable gating signals in order to provide said write enable signals.

10. A logic device as in claim 6 wherein said control output signals are masked by one or more write enable gating signals in order to provide said write enable signals.

11. A logic device as in claim 3 which further comprises a read enable storage device having one or more data input leads for receiving control output signals from said logic array, a data output lead for providing a read enable signal, and one or more read enable clock leads for receiving read enable clock signals for causing said storage device to provide said read enable signal.

12. A logic device as in claim 4 which further comprises a write enable storage device having one or more data input leads for receiving control output signals from said logic array, a data output lead for providing a write enable signal, and one or more write enable clock leads for receiving write enable clock signals for causing said storage device to provide said write enable signal.

13. A logic device comprising:
    a plurality of N control input leads for receiving a plurality of N control input signals, where N is a first positive integer;
    a logic array including means for receiving said plurality of control input signals and providing a plurality of J control output signals as a function of said plurality of input signals, where J is a second positive integer greater than or equal to one;
    a plurality of P data input leads for receiving a plurality of P input data signal, where P is an integer greater than or equal to one;
    a plurality of Q data output leads for providing a plurality of Q data output signals, where Q is an integer greater than or equal to one;
    data means for providing said plurality of Q data output signals as a function of said P data input signals and as controlled by said J control output signals; and an enable logic array comprising:
L enable input leads for receiving L enable input signals, where L is a positive integer;
means for receiving said J control output signals from said logic array; and
means for providing K enabled control signals to said data means in response to said L enable input signals and said J control output signals.

14. A logic device comprising:
a plurality of N control input leads for receiving a plurality of N control input signals, where N is a first positive integer;
a logic array including means for receiving said plurality of control input signals and providing a plurality of J control output signals as a function of said plurality of input signals, where J is a second positive integer greater than or equal to one;
a plurality of P data input leads for receiving a plurality of P input data signal, where P is an integer greater than or equal to one;
a plurality of Q data output leads for providing a plurality of Q data output signals, where Q is an integer greater than or equal to one; and
data means for providing said plurality of Q data output signals as a function of said P data input signals and as controlled by said J control output signals, said data means comprising one or more logic/storage elements, each said logic/storage element comprising:

one or more data input leads coupled to associated ones of said P data input leads;
one or more data output leads coupled to associated ones of said Q data output leads;
one or more serial data or control input leads; and
one or more serial data or status output leads.

15. A logic device as in claim 14 wherein at least one of said serial data or control input leads and said serial data or status output leads of adjacent ones of said logic/storage elements are coupled in cascade.

16. A logic device as in claim 14 wherein said logic/storage elements are capable of performing functions selected from the group of functions consisting of buffer, register, combinatorial logic, registered logic, arithmetic function, multiplexor, demultiplexor, and tristate control.

17. A logic device as in claim 1 wherein said data means comprises a register file comprising one or more registers, each said register comprising:
one or more input leads coupled to associated ones of said P data input leads;
one or more output leads coupled to associated ones of said P data output leads;
means for receiving one or more of said J control output signals.

18. A logic device as in claim 17 wherein said one or more input leads are configured as R input ports, where R is a positive integer and said one or more output leads are configured as S output ports, where S is a positive integer which need not be equal to R.

19. A logic device as in claim 17 wherein said registers comprise transparent or edge-triggered registers.

* * * * *